(12) United States Patent
Hua et al.

(10) Patent No.: US 8,988,949 B2
(45) Date of Patent: Mar. 24, 2015

(54) HEADER CIRCUIT FOR CONTROLLING SUPPLY VOLTAGE OF A CELL

(71) Applicant: Taiwan Semiconductor Manufacturing Company Limited, Hsin-Chu (TW)

(72) Inventors: Chung-Hsien Hua, Hsinchu (TW); Chung-Yi Wu, Zhubei (TW); Chen-Lin Yang, Zhubei (TW); Cheng Hung Lee, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 167 days.

(21) Appl. No.: 13/633,222

(22) Filed: Oct. 2, 2012

(65) Prior Publication Data

US 2014/0092695 A1    Apr. 3, 2014

(51) Int. Cl.
*G11C 7/00*    (2006.01)
(52) U.S. Cl.
USPC ..................................... 365/189.11
(58) Field of Classification Search
CPC .................. G11C 11/00; G11C 5/14
See application file for complete search history.

(56) References Cited

U.S. PATENT DOCUMENTS 7,643,357 B2 * 1/2010 Braceras et al. ......... 365/189.09
2009/0207650 A1 * 8/2009 Braceras et al. ............. 365/156

* cited by examiner

*Primary Examiner* — Hoai V Ho
*Assistant Examiner* — Pablo Huerta
(74) *Attorney, Agent, or Firm* — Cooper Legal Group, LLC

(57) ABSTRACT

One or more techniques or systems for controlling a supply voltage of a cell are provided herein. Additionally, one or more techniques or systems for mitigating leakage of the cell are provided. In some embodiments, a header circuit is provided, including a first pull-up p-type metal-oxide-semiconductor (PMOS) transistor including a first gate, a first source, and a first drain. Additionally, the header circuit includes a second pull-down PMOS transistor including a second gate, a second source, and a second drain. In some embodiments, the first drain of the first pull-up PMOS transistor is connected to the second source of the second pull-down PMOS transistor and a supply voltage line for one or more cells. In this manner, a pull-down PMOS is configured to control the supply voltage of the cell, thus facilitating voltage control for a write assist, for example.

20 Claims, 11 Drawing Sheets

HEADER CIRCUIT FOR CONTROLLING SUPPLY VOLTAGE OF A CELL

BACKGROUND

Generally, a static random access memory (SRAM) cell, such as a SRAM bitcell, requires a write assist technique to facilitate a write operation for the SRAM cell. However, traditional write assist techniques are generally associated with undesirable leakage, corruption of data stored in the SRAM cell, or a requirement for an additional supply voltage, for example. Additionally, some traditional write assist techniques are difficult to control, for example.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

One or more techniques, systems, or circuits for controlling a supply voltage for a cell are provided herein. In some embodiments, a header circuit for controlling the supply voltage of the cell is provided, comprising a first pull-up p-type metal-oxide-semiconductor (PMOS) transistor comprising a first gate, a first source, and a first drain. In some embodiments, the header circuit comprises a second pull-down PMOS transistor comprising a second gate, a second source, and a second drain, the first drain of the first pull-up PMOS transistor connected to the second source of the second pull-down PMOS transistor and a supply voltage line for one or more cells. In some embodiments, the header circuit comprises a passing unit configured to control a connection between the first gate of the first pull-up PMOS transistor and the first drain of the first pull-up PMOS transistor. For example, the passing unit enables the first pull-up PMOS to be configured as a diode connected PMOS transistor. In some embodiments, a header circuit is configured to achieve a write assist by controlling a supply voltage for a cell by using a PMOS transistor as a pull-down transistor for the header circuit. Additionally, the header circuit is configured to facilitate power management by clamping the supply voltage at a threshold voltage drop below a supply voltage level. In some embodiments, a pull-up control unit of the header circuit is configured for sequential wakeup of one or more header circuits. In this way, the header circuit is configured to enhance write-ability of the SRAM cell, such as a static random access memory (SRAM) cell, or mitigate associated leakage.

The following description and annexed drawings set forth certain illustrative aspects and implementations. These are indicative of but a few of the various ways in which one or more aspects are employed. Other aspects, advantages, or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements, structures, etc. of the drawings are not necessarily drawn to scale. Accordingly, the dimensions of the same may be arbitrarily increased or reduced for clarity of discussion, for example.

DETAILED DESCRIPTION

Figure 1:
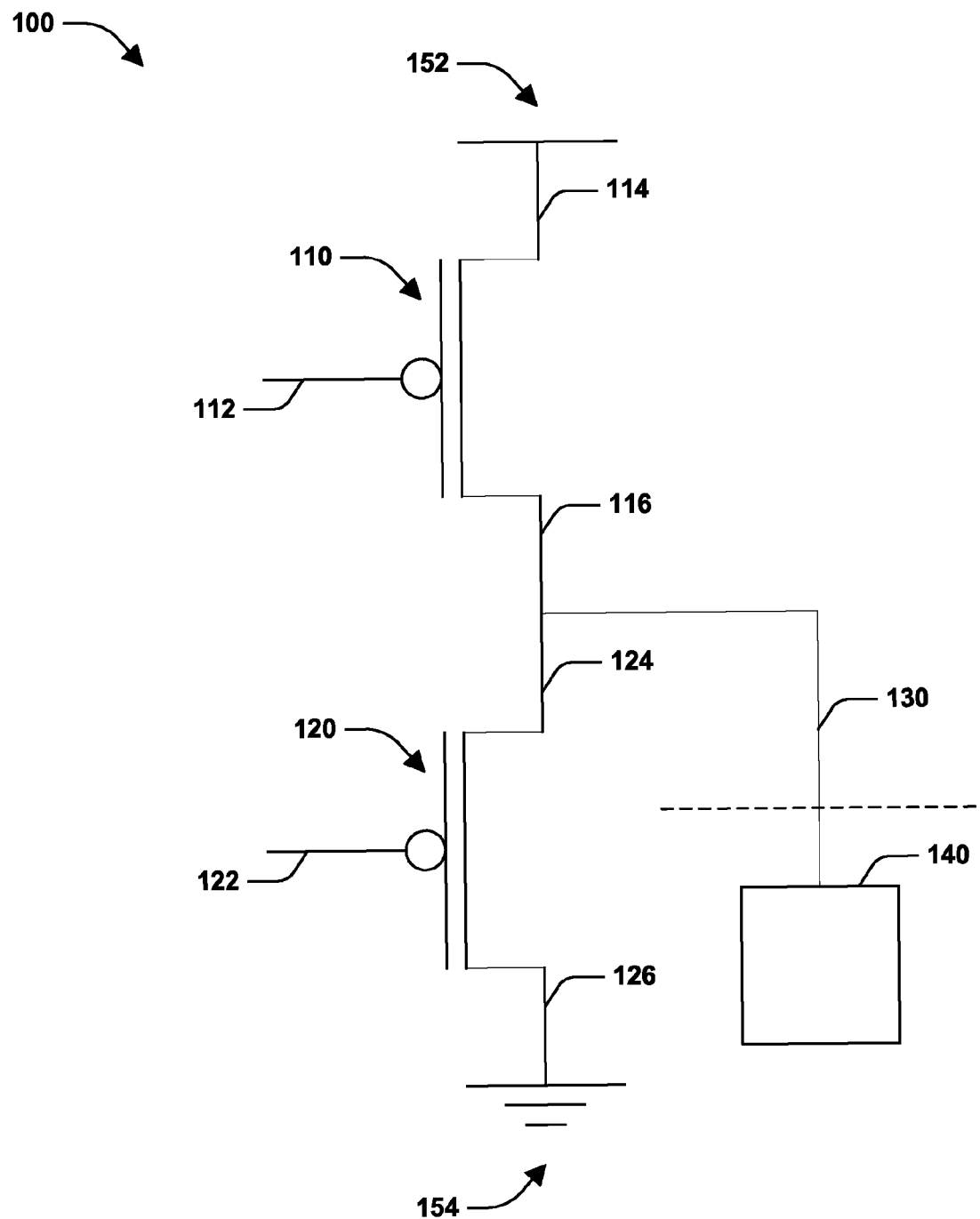
FIG. 1 is a schematic diagram of an example header circuit for controlling a supply voltage of a cell, according to some embodiments.

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It is evident, however, that the claimed subject matter may be practiced without these specific details. In other instances, structures and devices are illustrated in block diagram form in order to facilitate describing the claimed subject matter.

It will be appreciated that in some embodiments, a logic high voltage, a logic high signal, or a logic high is referenced as "1" and a logic low voltage, a logic low signal, or a logic low is referenced as "0", for example.

FIG. 1 is a schematic diagram 100 of an example header circuit for controlling a supply voltage of a cell, according to some embodiments. For example, the header circuit comprises a first pull-up p-type metal-oxide-semiconductor (PMOS) transistor 110, a second pull-down PMOS transistor 120. In some embodiments, the first pull-up PMOS transistor 110 is configured to pull a voltage level of a supply voltage line 130 up, such as to a positive supply voltage (Vdd) 152. In some embodiments, the second pull-down PMOS transistor 120 is configured to pull the voltage level of the supply voltage line 130 down, such as to a threshold voltage or a PMOS threshold voltage. In some embodiments, the first pull-up PMOS transistor 110 comprises a first source 114, a first gate 112, and a first drain 116. In some embodiments, the second pull-down PMOS transistor 120 comprises a second source 124, a second gate 122, and a second drain 126. For example, the first source 114 is connected to a positive supply voltage, such as Vdd 152, the first drain 116 is connected to the supply voltage line 130 and the second source 124. Additionally, the second drain 126 is connected to a negative supply voltage (Vss) 154. In some embodiments, the second source 124 is connected to the first drain 116 and the supply voltage line 130. The supply voltage line 130 is connected to a memory cell 140. In some embodiments, the memory cell 140 is a static random access memory (SRAM) cell, such as a SRAM bitcell, for example. It will be appreciated that in some embodiments, the header circuit does not comprise the memory cell 140, as indicated by the dashed line. In some embodiments, the memory cell 140 comprises a column of memory cells coupled to the same supply voltage line 130.

In some embodiments, a p-type metal-oxide-semiconductor (PMOS) transistor turns on in response to a logic low voltage applied to a gate of the PMOS transistor and at least a PMOS threshold voltage is applied to a source of the PMOS transistor. In some embodiments, a memory cell 140 or a supply voltage line 130 for the memory cell 140 is at a voltage level around a positive supply voltage, such as Vdd 152 during a read operation for the memory cell 140. In some embodiments, it is desirable for the memory cell 140 or the supply voltage line 130 for the memory cell 140 to be at a voltage level lower than Vdd 152 during a write operation for the memory cell 140. For example, adjusting the voltage level of the supply voltage line 130 for the write operation is a write assist. In some embodiments, a voltage level of the supply voltage line 130 is reduced from a first voltage, such as Vdd, to a write assist voltage, such as a voltage threshold, a voltage threshold drop below Vdd, etc.

Accordingly, when a logic high voltage is applied to the second gate 122 of the second pull-down PMOS transistor 120, the second pull-down PMOS transistor 120 is off and will not form a connection between the supply voltage line 130 and the negative supply voltage (Vss) 154. In some embodiments, a logic high voltage is applied to the second gate 122 of the second pull-down PMOS transistor 120 and a logic low voltage is applied to the first gate 112 of the first pull-up PMOS transistor 110. Additionally, the first source 114 of the first pull-up PMOS transistor 110 is connected to Vdd 152. Therefore, the second pull-down PMOS transistor 120 is off and the first pull-up PMOS transistor 110 is on, thus forming a connection between Vdd 152 and the supply voltage line 130, at least because a logic low voltage is applied to the first gate 112, the first source 114 is connected to Vdd 152, and Vdd 152 is greater than the PMOS threshold voltage. Accordingly, the connection between Vdd 152 and the supply voltage line 130 thus enables the first pull-up PMOS transistor 110 to pull up a voltage level of the supply voltage line 130 to Vdd 152, for example. In some embodiments, it is desirable to lower the voltage level of the supply voltage line 130, for example.

In some embodiments, a write assist is enabled by the header circuit to adjust a voltage level of the supply voltage line 130. In some examples, the voltage level of the supply voltage line 130 is at Vdd 152 after a read operation. Accordingly, a logic high voltage is applied to the first gate 112 of the first pull-up PMOS transistor 110, and thus the first pull-up PMOS transistor 110 is off and will not form the connection between Vdd 152 and the supply voltage line 130 to pull up the voltage level of the supply voltage line 130. In some embodiments, a logic high voltage is applied to the first gate 112 of the first pull-up PMOS transistor 110 and a logic low voltage is applied to the second gate 122 of the second pull-down PMOS transistor 120. In some embodiments, the second source 124 of the second pull-down PMOS transistor 120 is connected to the supply voltage line 130. Therefore, the first pull-up PMOS transistor 110 is off and the second pull-down PMOS transistor 120 is on, thus forming a connection between the supply voltage line 130 and Vss 154, at least because a logic low voltage is applied to the second gate 122, the second source 124 is connected to the supply voltage line 130, a voltage level of the supply voltage line 130 is at Vdd 152, and the voltage level of the supply voltage line 130 is greater than the PMOS threshold voltage. Accordingly, the connection between the supply voltage line 130 and Vss 154 thus enables the second pull-down PMOS transistor 120 to pull down the voltage level of the supply voltage line 130, for example. In some embodiments, the voltage level of the supply voltage line 130 is pulled down to a PMOS threshold voltage at least because a PMOS transistor generally turns on when at least the PMOS threshold voltage is applied to a source of the PMOS transistor. For example, when the second pull-down PMOS transistor 120 forms a connection between the voltage supply line 130 to Vss 154, a voltage level of the voltage supply line 130 is Vdd 152 at a first time. According to some aspects, the connection formed by the second pull-down PMOS transistor 120 pulls the voltage level of the voltage supply line 130 to a voltage level less than Vdd 152 at a second time. In some embodiments, the connection formed by the second pull-down PMOS transistor 120 pulls the voltage level of the voltage supply line 130 to a voltage level around the PMOS threshold voltage at a third time. Accordingly, when the voltage level of the supply voltage line 130 is lower than the PMOS threshold voltage, a voltage of the second source 124 of the second pull-down PMOS transistor 120 is no longer above the PMOS threshold voltage, thus turning the second pull-down PMOS transistor 120 off and controlling the voltage level of the supply voltage line 130. For example, the voltage level of the supply voltage line 130 drops from Vdd 152 to the PMOS threshold voltage. In this way, write assist is thus provided by the header circuit of FIG. 1 at least because the second transistor 120 utilizes a PMOS configuration to achieve a pull down effect for the supply voltage line 130, for example.

Figure 2:
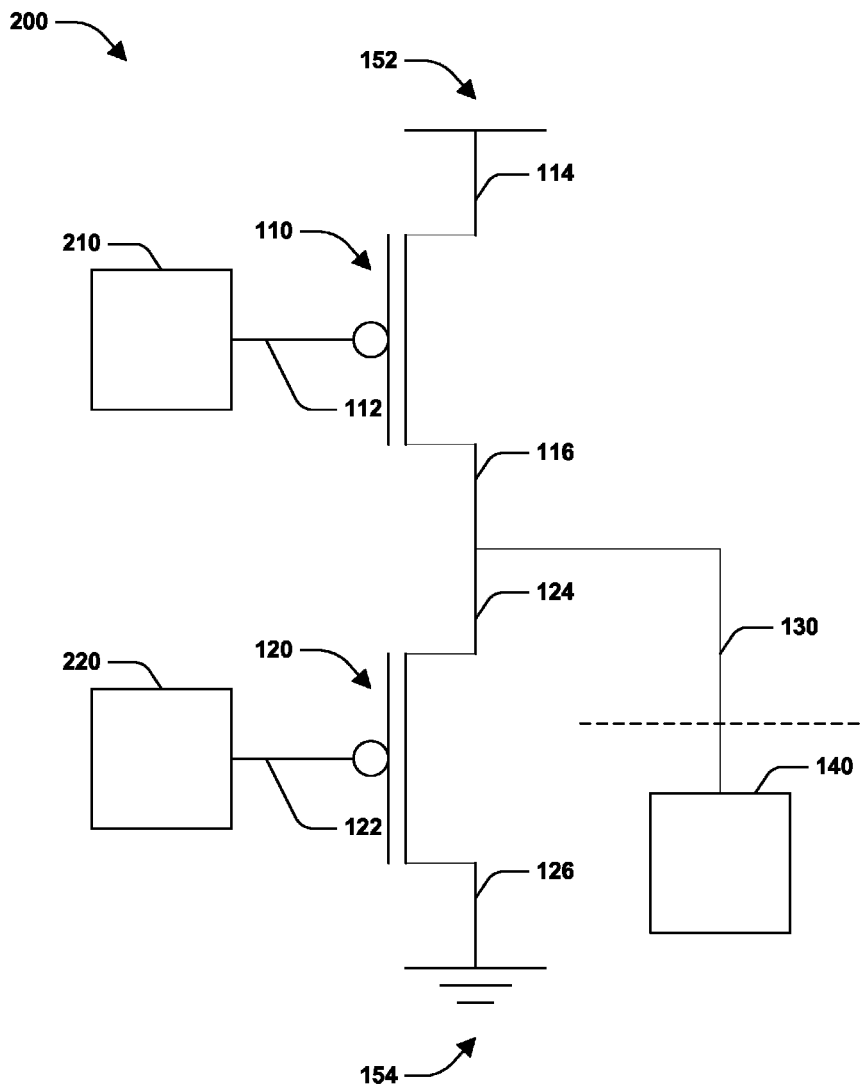
FIG. 2 is a schematic diagram of an example header circuit for controlling a supply voltage of a cell, according to some embodiments.

FIG. 2 is a schematic diagram 200 of an example header circuit for controlling a supply voltage of a cell, according to some embodiments. It will be appreciated that the schematic diagram 200 of FIG. 2 is similar to the schematic diagram 100 of FIG. 1, except that the first gate 112 of the first pull-up PMOS transistor 110 is connected to a pull-up control unit 210 and the second gate 122 of the second pull-down PMOS transistor 120 is connected to a pull-down control unit 220. In some embodiments, the pull-up control unit 210 is configured to bias the first gate 112, such as by producing a logic high output to facilitate a write assist. In some embodiments, the pull-down control unit 220 is configured to bias the second gate 122, such as by producing a logic low output to facilitate a write assist. In some embodiments, the pull-up control unit 210 is configured to bias the first gate 112 in an opposite manner of the pull-down control unit 220. For example, when the pull-up control unit 210 biases the first gate 112 with a logic low voltage, the pull-down control unit 220 biases the second gate 122 with a logic high voltage to turn the first pull-up PMOS transistor 110 on and the second pull-down PMOS transistor 120 off, thus enabling the header circuit to pull up a voltage level of the supply voltage line 130 to Vdd 152. Conversely, when the pull-up control unit 210 biases the first gate 112 with a logic high voltage, the pull-down control unit 220 biases the second gate 122 with a logic low voltage to turn the first pull-up PMOS transistor 110 off and the second pull-down PMOS transistor 120 on, thus enabling the header circuit to pull down the voltage level of the supply voltage line 130. In some embodiments, the pull-up control unit 210 is configured to bias the first gate 112 based on at least one of a shut down signal, a bank select signal, a write mux signal, a shut down output signal, or a shut down input signal. In some embodiments, the pull-down control unit 220 is configured to bias the second gate 122 based on at least one of the bank select signal or the write mux signal. It will be appreciated that in some embodiments, the header circuit does not comprise the memory cell 140, as indicated by the dashed line. In some embodiments, the pull-up control unit 210 comprises a pull-up control circuit. In some embodiments, the pull-down control unit 220 comprises a pull-down control circuit. Additionally, in some embodiments, the pull-up control unit 210 is configured to produce an output opposite of the pull-down control unit 220 or vice versa. In this way, the first gate 112 is biased in an opposite direction of the second gate 122.

In some embodiments, the header circuit or associated SRAM is in a standby mode, such that the SRAM is not being accessed. For example, during standby mode, the pull-up control unit 210 is configured to bias the first gate 112 with a logic low output and the pull-down control unit 220 is configured to bias the second gate 122 with a logic high output, for example. In this way, the header circuit is configured to pull a voltage level of the supply voltage line 130 up to Vdd 152, at least because such biasing activates the first pull-up PMOS transistor 110 and deactivates the second pull-down PMOS transistor 120.

In some embodiments, the header circuit or associated SRAM is in a shutdown mode. For example, during shutdown mode, the pull-up control unit 210 is configured to bias the first gate 112 with a logic high output and the pull-down control unit 220 is configured to bias the second gate 122 with a logic high output, for example. In this way, the header circuit is configured to float a voltage level of the supply voltage line 130, at least because such biasing activates the first pull-up PMOS transistor 110 and the second pull-down PMOS transistor 120 in a concurrent fashion.

Figure 3:
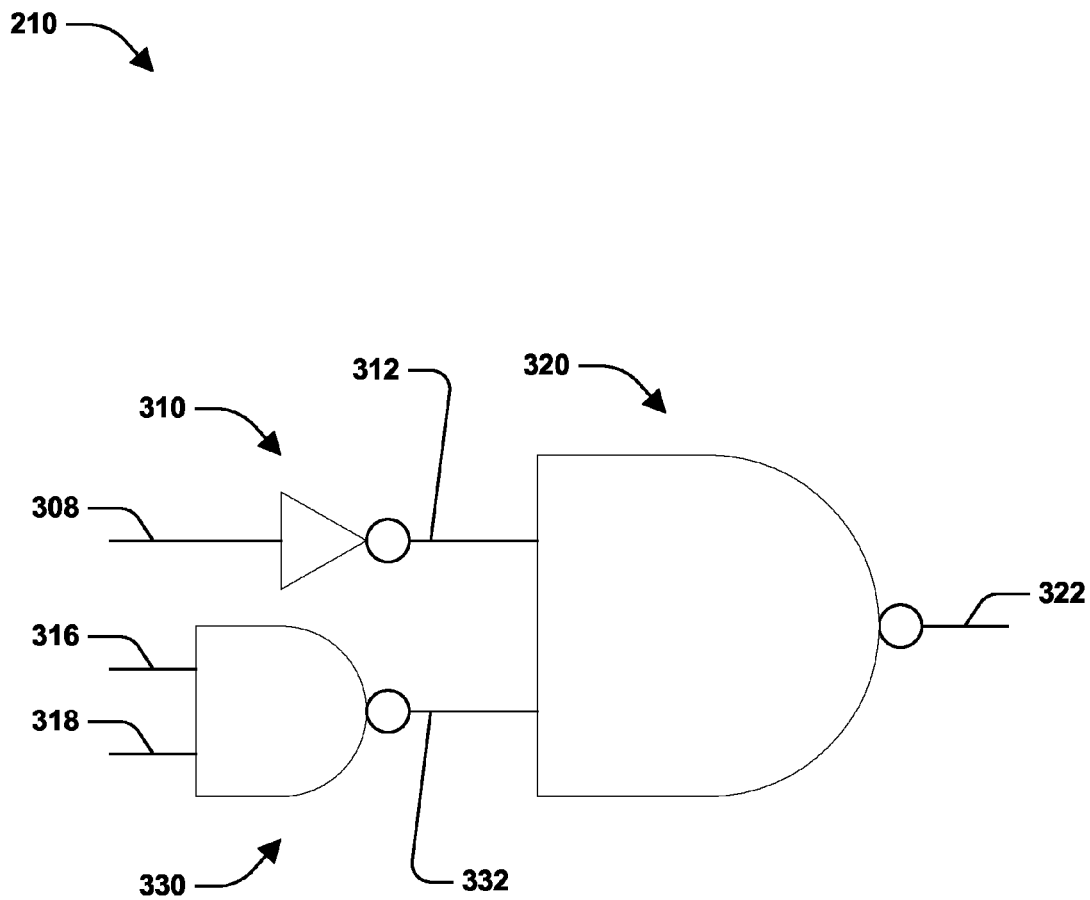
FIG. 3 is a schematic diagram of an example pull-up control unit for a header circuit for controlling a supply voltage of a cell, according to some embodiments.

FIG. 3 is a schematic diagram 210 of an example pull-up control unit for a header circuit for controlling a supply voltage of a cell, according to some embodiments. For example, the pull-up control unit is configured to control biasing for a first gate of a first pull-up PMOS transistor, such as the first gate 112 of the first pull-up PMOS transistor 110. In some embodiments, the pull-up control unit comprises an inverter 310, a first NAND gate 320, and a second NAND gate 330. Additionally, an output of the inverter 312 is connected to a first input of the first NAND gate 320. In some embodiments, an input of the inverter 308 is connected to a shut down signal. According to some aspects, an output of the second NAND gate 332 is connected to a second input of the first NAND gate 320, where a first input of the second NAND gate 316 is connected to a bank select signal, and a second input of the second NAND gate 318 is connected to a write mux signal. Accordingly, an output of the first NAND gate 322 is an output of the pull-up control unit and is connected to a first gate of a first pull-up PMOS transistor, such as the first gate 112 of the first pull-up PMOS transistor 110 of FIG. 1 or FIG. 2, for example. In some embodiments, the output of the first NAND gate 322 is a pull-up control signal. Therefore, the first gate 112 of the first pull-up PMOS transistor 110 is biased based on at least one of the shut down signal, the bank select signal, or the write mux signal. It will be appreciated that in other embodiments, any combination of logic is used for the pull-up control unit, so long as a truth table of the combination of logic is equivalent to a truth table for the schematic diagram 210 of the example pull-up control unit.

For example, if SD=a shut down signal, BS=a bank select signal, and Y=a write mux signal, the pull-up control unit is configured according to:

¬(¬(BS^Y)^¬SD)=

¬(P^Q), where

P=¬(BS^Y)

Q=¬SD

Accordingly, ¬(P^Q)=(¬P)v(¬Q), where (¬P)=¬(¬(BS^Y))=(BS^Y)

(¬Q)=¬(¬SD)=SD

Therefore, (¬P)v(¬Q)=(BS^Y)v SD.

It will be appreciated, however, that in other embodiments, other logic is implemented to achieve a similar logic function or truth table, for example.

In some embodiments, the shut down signal SD is high when entering a shut down mode. Additionally, the bank select signal BS is high when a bank is selected. In some embodiments, the write mux signal Y is high when a column associated with Y is selected.

Figure 4:
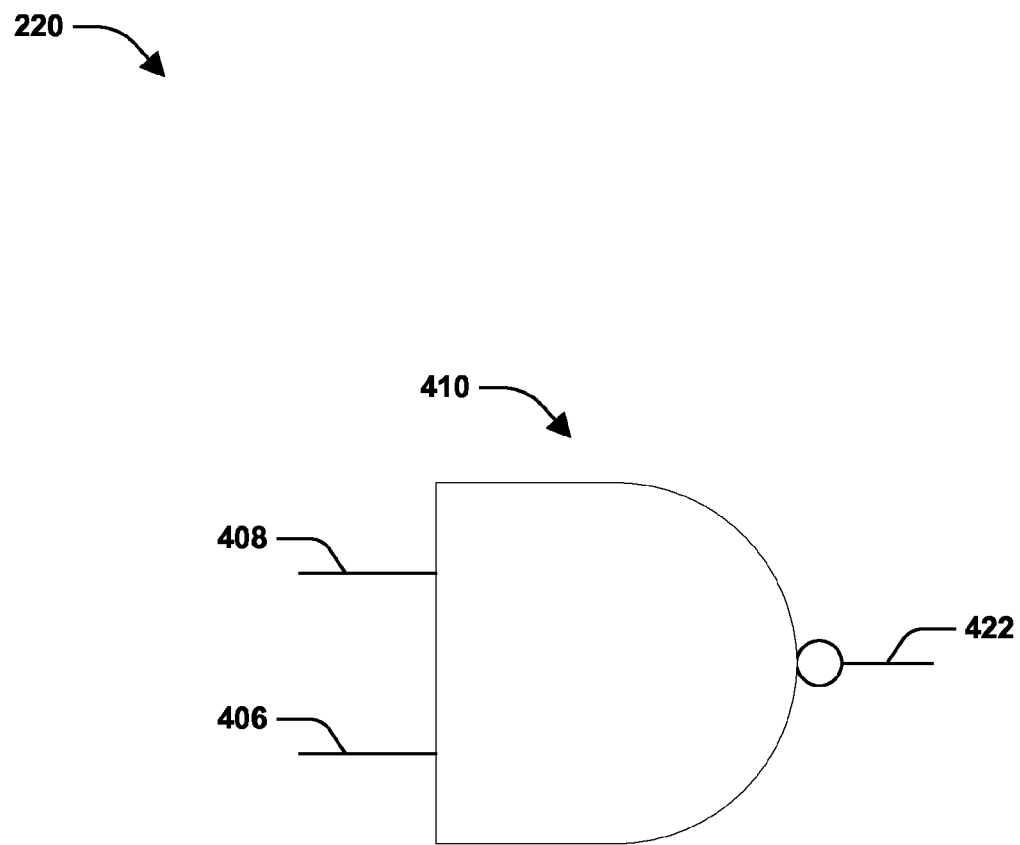
FIG. 4 is a schematic diagram of an example pull-down control unit for a header circuit for controlling a supply voltage of a cell, according to some embodiments.

FIG. 4 is a schematic diagram 220 of an example pull-down control unit for a header circuit for controlling a supply voltage of a cell, according to some embodiments. For example, the pull-down control unit is configured to control biasing for a second gate of a second pull-down PMOS transistor, such as the second gate 122 of the second pull-down PMOS transistor 120. In some examples, the pull-down control unit is configured to control a pull-down unit. In some embodiments, the pull-down control unit comprises a NAND gate 410 comprising a first input 408, a second input 406, and an output 422. In some embodiments, a first input of the NAND gate 408 is connected to a bank select signal and a second input of the NAND gate 406 is connected to a write mux signal. In other embodiments, a first input of the NAND gate 408 is connected to the write mux signal and a second input of the NAND gate 406 is connected to the bank select signal. Accordingly, an output of the NAND gate 422 is connected to a second gate of a second pull-down PMOS transistor, such as the second gate 122 of the second pull-down PMOS transistor 120 of FIG. 1 or FIG. 2, for example. In some embodiments, the output of the NAND gate 422 is a pull-down control signal. Therefore, the second gate 122 of the second pull-down PMOS transistor 120 is biased based on at least one of the bank select signal or the write mux signal. It will be appreciated that in other embodiments, any combination of logic is used for the pull-down control unit, so long as a truth table of the combination of logic is equivalent to a truth table for the schematic diagram 220 of the example pull-down circuit.

For example, if BS=a bank select signal and Y=a write mux signal, the pull-down control unit is configured according to ¬(BS^Y) in some embodiments.

Figure 5:
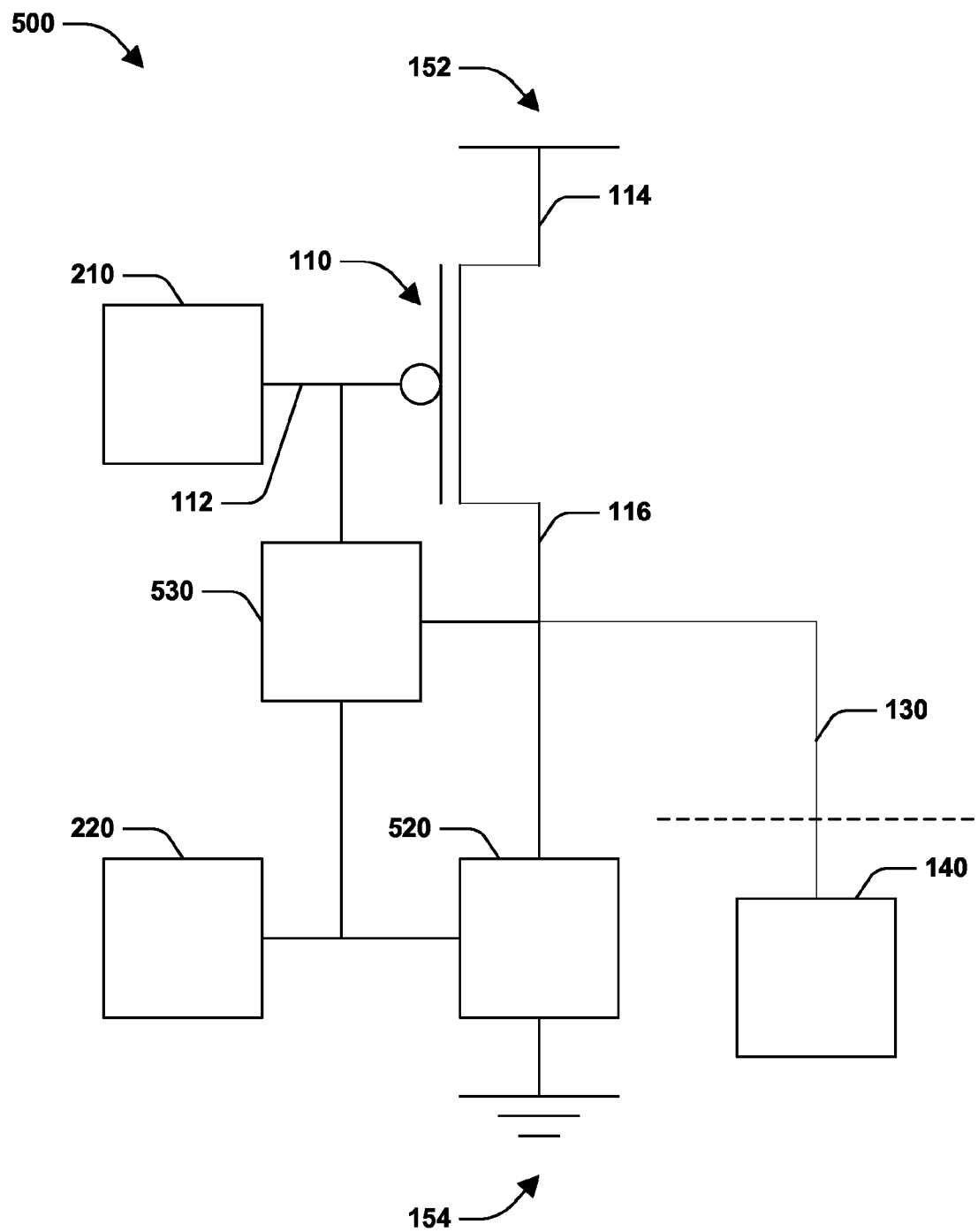
FIG. 5 is a schematic diagram of an example header circuit for controlling a supply voltage of a cell, according to some embodiments.

FIG. 5 is a schematic diagram 500 of an example header circuit for controlling a supply voltage of a cell, according to some embodiments. In some embodiments, the header circuit comprises a first pull-up PMOS transistor 110, a pull-up control unit 210, a passing unit 530, a pull-down unit 520, and a pull-down control unit 220. In some embodiments, the pull-down unit 520 is a second pull-down PMOS transistor, such as the second pull-down PMOS transistor 120 of FIG. 1. For example, the second pull-down PMOS transistor 120 comprises a second gate 122, a second source 124, and a second drain 126. Additionally, the first drain 116 of the first pull-up PMOS transistor 110 is connected to the second source 124 of the second pull-down PMOS transistor 120 and a supply voltage line 130 for one or more cells, such as cell 140. Additionally, the header circuit comprises the supply voltage line 130 in some embodiments. It will be appreciated that in some embodiments, the header circuit does not comprise the cell 140, as indicated by the dashed line.

For example, the first pull-up PMOS transistor 110 comprises a first gate 112, a first source 114, and a first drain 116. For example, the first source 114 is connected to a positive supply voltage (Vdd) 152. Additionally, the first gate 112 is connected to the pull-up control unit 210. In some embodiments, the pull-up control unit 210 is configured to control or bias the first gate 112 of the first pull-up PMOS transistor 110. Additionally, the first gate 112 and the pull-up control unit 210 are connected to the passing unit 530. For example, the passing unit 530 is a switch or a transistor that connects the first gate 112 to the first drain 116. In some embodiments, the passing unit 530 is connected to the pull-down control unit 220. For example, the pull-down control unit 220 is configured to control operation of the passing unit 530. Additionally, the pull-down control unit 220 is connected to a pull-down unit 520. Similarly, the pull-down control unit 220 is configured to control operation of the pull-down unit 520. In some embodiments, the passing unit 530 is connected to the pull-down unit 520. Additionally, the pull-down unit 520 is configured to control a connection between the supply voltage line 130 and a negative supply voltage (Vss) 154. In some embodiments, the pull-down unit 520 controls operation of the passing unit 530 at least because the pull-down unit forms the connection to Vss 154 such that the passing unit 530 is connected to Vss 154. In some embodiments, the first drain 116 is connected to the passing unit 530, the pull-down unit 520, and the supply voltage line 130. The supply voltage line 130 is connected to a memory cell 140. In some embodiments, the memory cell 140 is a static random access memory (SRAM) cell, such as a SRAM bitcell, for example.

In some embodiments, the passing unit 530 is configured to control a connection between the first gate 112 of the first pull-up PMOS transistor 110 and the first drain 116 of the first pull-up PMOS transistor 110. For example, the passing unit 530 is a switch or a transistor that connects the first gate 112 to the first drain 116. In some embodiments, the passing unit 530 comprises a passing transistor. For example, the passing transistor 630 comprises a PMOS transistor comprising a passing gate 612, a passing source 614, and a passing drain 616. According to some aspects, the passing source is connected to the first gate 112, the passing gate is connected to a second gate, such as the second gate 122 of the second pull-down PMOS transistor 120 or a gate of the pull-down unit 520. In some embodiments, the passing drain is connected to the first drain 116, the supply voltage line 130, and a second source, such as the second source 124 of the second pull-down PMOS transistor 120 or a source of the pull-down unit 520. Accordingly, the passing unit 530 enables the first pull-up PMOS transistor 110 to act as a diode connected PMOS transistor. Therefore, the passing unit 530 enables the first drain 116 of the first pull-up PMOS transistor 110 to stabilize at a PMOS threshold voltage below Vdd 152.

In some embodiments, the pull-up control unit 210 is configured to bias the first gate 112 of the first pull-up PMOS transistor 110. For example, the pull-up control unit 210 is configured to bias the first gate 112 based on at least one of a shut down signal, a bank select signal, a write mux signal, a shut down output signal, or a shut down input signal.

In some embodiments, the pull-down control unit 220 is configured to control the pull-down unit 520. For example, the pull-down control unit 220 is configured to control the pull-down unit 520 based on at least one of the bank select signal or the write mux signal. In some embodiments, the first pull-up PMOS transistor 110 is configured to pull a voltage level of the supply voltage line 130 up, such as to Vdd 152. In some embodiments, the pull-down unit 520 is configured to pull the voltage level of the supply voltage line 130 down. In some embodiments, the passing unit 530 clamps the voltage level of the supply voltage line 130 at one PMOS threshold voltage below Vdd 152, for example.

Figure 6:
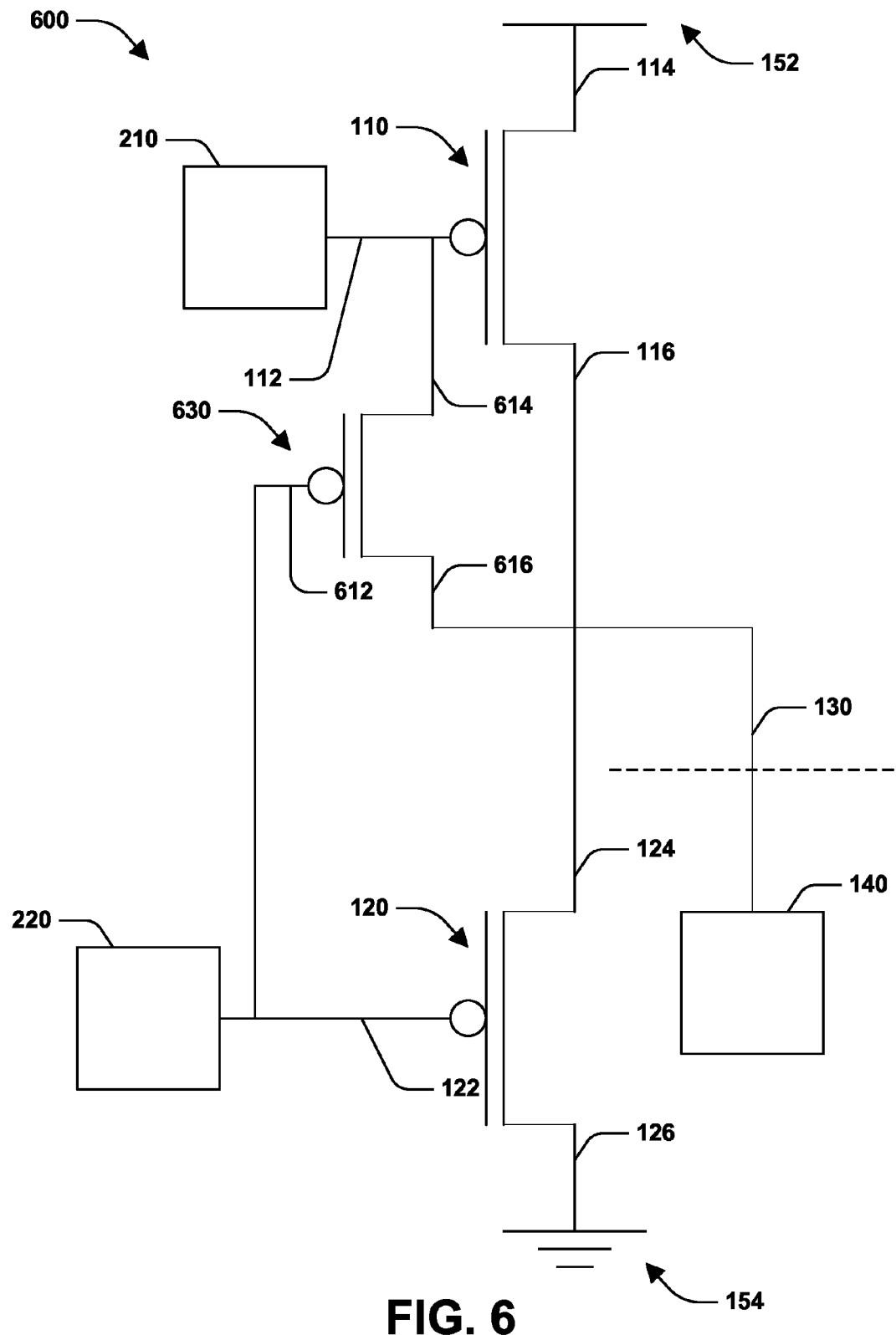
FIG. 6 is a schematic diagram of an example header circuit for controlling a supply voltage of a cell, according to some embodiments.

FIG. 6 is a schematic diagram 600 of an example header circuit for controlling a supply voltage of a cell, according to some embodiments. It will be appreciated that in some embodiments, the header circuit does not comprise the memory cell 140, as indicated by the dashed line.

In some embodiments, the header circuit comprises a first pull-up PMOS transistor 110, a second pull-down PMOS transistor 120, a passing transistor 630, a pull-up control unit 210, and a pull-down control unit 220. For example, the first pull-up PMOS transistor 110 comprises a first gate 112, a first source 114, and a first drain 116, the second pull-down PMOS transistor 120 comprises a second gate 122, a second source 124, and a second drain 126, the passing transistor 630 comprises a passing gate 612, a passing source 614, and a passing drain 616. In some embodiments, the pull-up control unit 210 is the pull-up control unit 210 of at least one of FIG. 3, FIG. 7, or FIG. 8, and the pull-down control unit 220 is the pull-down control unit of FIG. 4. In some embodiments, the header circuit is connected to or comprises a voltage supply line 130 for one or more cells 140. In some embodiments, a cell of the one or more cells 140 is a static random access memory cell (SRAM) cell or an SRAM bitcell, for example.

In some embodiments, the pull-up control unit 210 is connected to the first gate 112 of the first pull-up PMOS transistor 110 and the passing source 614 of the passing transistor 630. In some embodiments, the pull-down control unit 220 is connected to the second gate 122 of the second pull-down PMOS transistor 120 and the passing gate 612 of the passing transistor 630. In some embodiments, the first source 114 of the first pull-up PMOS transistor 110 is connected to a positive supply voltage, such as Vdd 152. In some embodiments, the second drain 126 of the second pull-down PMOS transistor 120 is connected to a negative supply voltage, such as Vss 154. In some embodiments, the supply voltage line 130 is connected to the first drain 116 of the first pull-up PMOS transistor 110, the passing drain 616 of the passing transistor 630, the second source 124 of the second pull-down PMOS transistor 120, and one or more cells 140.

In some embodiments, a p-type metal-oxide-semiconductor (PMOS) transistor turns on in response to a logic low voltage applied to a gate of the PMOS transistor and at least a PMOS threshold voltage is applied to a source of the PMOS transistor. Conversely, a PMOS transistor turns off in response to a logic high voltage applied to the gate of the PMOS transistor and a voltage less than the PMOS threshold voltage applied to the source of the PMOS transistor. Accordingly, when a logic high voltage or a "1" is applied to the second gate 122 of the second pull-down PMOS transistor 120, the second pull-down PMOS transistor 120 is off and does not form a connection between the supply voltage line 130 and the negative supply voltage (Vss) 154. In some embodiments, a logic high voltage is applied to the second gate 122 of the second pull-down PMOS transistor 120 and a logic low voltage is applied to the first gate 112 of the first pull-up PMOS transistor 110 to pull up a voltage level of the supply voltage line 130. Therefore, the second pull-down PMOS transistor 120 is off and the first pull-up PMOS transistor 110 is on, thus forming a connection between Vdd 152 and the supply voltage line 130. Accordingly, the connection between Vdd 152 and the supply voltage line 130 pulls a voltage level of the supply voltage line 130 up to Vdd 152, for example. In other embodiments, it is desirable to lower the voltage level of the supply voltage line 130, such as to one PMOS threshold drop below Vdd, for example.

For example, when a logic high voltage is applied to the first gate 112 of the first pull-up PMOS transistor 110, the first pull-up PMOS transistor 110 is off and will not form a connection between Vdd 152 and the supply voltage line 130. Therefore, a voltage level of the supply voltage line 130 is not pulled up. Additionally, a logic low voltage is applied to the second gate 122 of the second pull-down PMOS transistor 120 and the passing gate 612 of the passing transistor 630, thus forming a connection between the supply voltage line 130 and Vss 154. Additionally, a connection is formed between the supply voltage line 130, the first drain 116 of the first pull-up PMOS transistor 110, the second source 124 of the second pull-down PMOS transistor 120, and the first gate 112 of the first pull-up PMOS transistor 110. In some embodiments, the passing transistor 630 acts as a pull-down clamp mechanism. For example, the connection between the first drain 116 of the first pull-up PMOS transistor 110 and the first gate 112 of the first pull-up PMOS transistor 110 enables the first pull-up PMOS transistor 110 to act as a diode connected PMOS transistor. For example, a voltage level of the supply voltage line 130 is clamped at Vdd−Vtp or one PMOS threshold voltage drop below Vdd 152 at least because an output of the pull-up control unit 210 is connected to the supply voltage line 130. Accordingly, the voltage level of the supply voltage line 130 is not pulled down to ground level, thus mitigating a possibility of data corruption for the SRAM cell, for example. In some embodiments, the voltage level of the supply voltage line is based on at least one of a design or a size of at least one of the first pull-up PMOS transistor 110, the second pull-down PMOS transistor 120, or the passing transistor 630, at least because the passing transistor 630 is configured to form a diode connected PMOS transistor with the first pull-up PMOS transistor 110. In some embodiments, a size of the first pull-up PMOS transistor 110 is greater than a size of the second pull-down PMOS transistor 120 to facilitate clamping of the voltage level of the supply voltage line 130, such as clamping the voltage level to at least one of Vdd−Vtp or one PMOS threshold voltage drop below Vdd 152.

In some embodiments, SD=a shut down signal, BS=a bank select signal, and Y=a write mux signal. For example, viewing FIG. 6 in view of at least one of FIG. 3, FIG. 4, FIG. 7, or FIG. 8, when SD=0, BS=1, and Y=1, a pull-up control signal generated by a pull-up control unit 210 is configured to connect a first gate 112 of the first pull-up PMOS transistor 110 to the supply voltage line 130 via a passing transistor 630. For example, when SD=0, BS=1, and Y=1, a pull-up control signal generated by the pull-up control unit 210 is "1" or a logic high voltage and a pull-down control signal generated by the pull-down control unit 220 is "0" or a logic low voltage. Accordingly, the first pull-up PMOS transistor 110 is turned off, the passing transistor 630 and the second pull-down transistor 120 are turned on, at least because a "1" is applied to the first gate 112 of the first pull-up PMOS transistor 110 and a "0" is applied to the second gate 122 of the second pull-down PMOS transistor 120 and the passing gate 612 of the passing transistor 630. Therefore, the supply voltage line 130 is clamped at one threshold voltage, such as a threshold PMOS voltage below Vdd 152.

In another example, when SD=0 and BS !=1 or Y !=1, the pull-up control signal generated by the pull-up control unit 210 is "0" or a logic low voltage, the pull-down control signal generated by the pull-down control unit 220 is "1" or a logic high voltage. Accordingly, the first pull-up PMOS transistor 110 is turned on and the passing transistor 630 and the second pull-down transistor 120 are turned off, at least because a "0" is applied to the first gate 112 of the first pull-up PMOS transistor 110 and a "1" is applied to the second gate 122 of the second pull-down PMOS transistor 120 and the passing gate 612 of the passing transistor 630. Therefore, a voltage level of the supply voltage line 130 is pulled up to Vdd 152.

In another example, when SD=1, the pull-up control signal generated by the pull-up control unit 210 is "1" or a logic high voltage and the pull-down control signal generated by the pull-down control unit 220 is "1" or a logic high voltage. Accordingly, the first pull-up PMOS transistor 110, the passing transistor 630, and the second pull-down transistor 120 are turned off, at least because a "0" is applied to the first gate 112 of the first pull-up PMOS transistor 110, the second gate 122 of the second pull-down PMOS transistor 120, and the passing gate 612 of the passing transistor 630.

Figure 7:
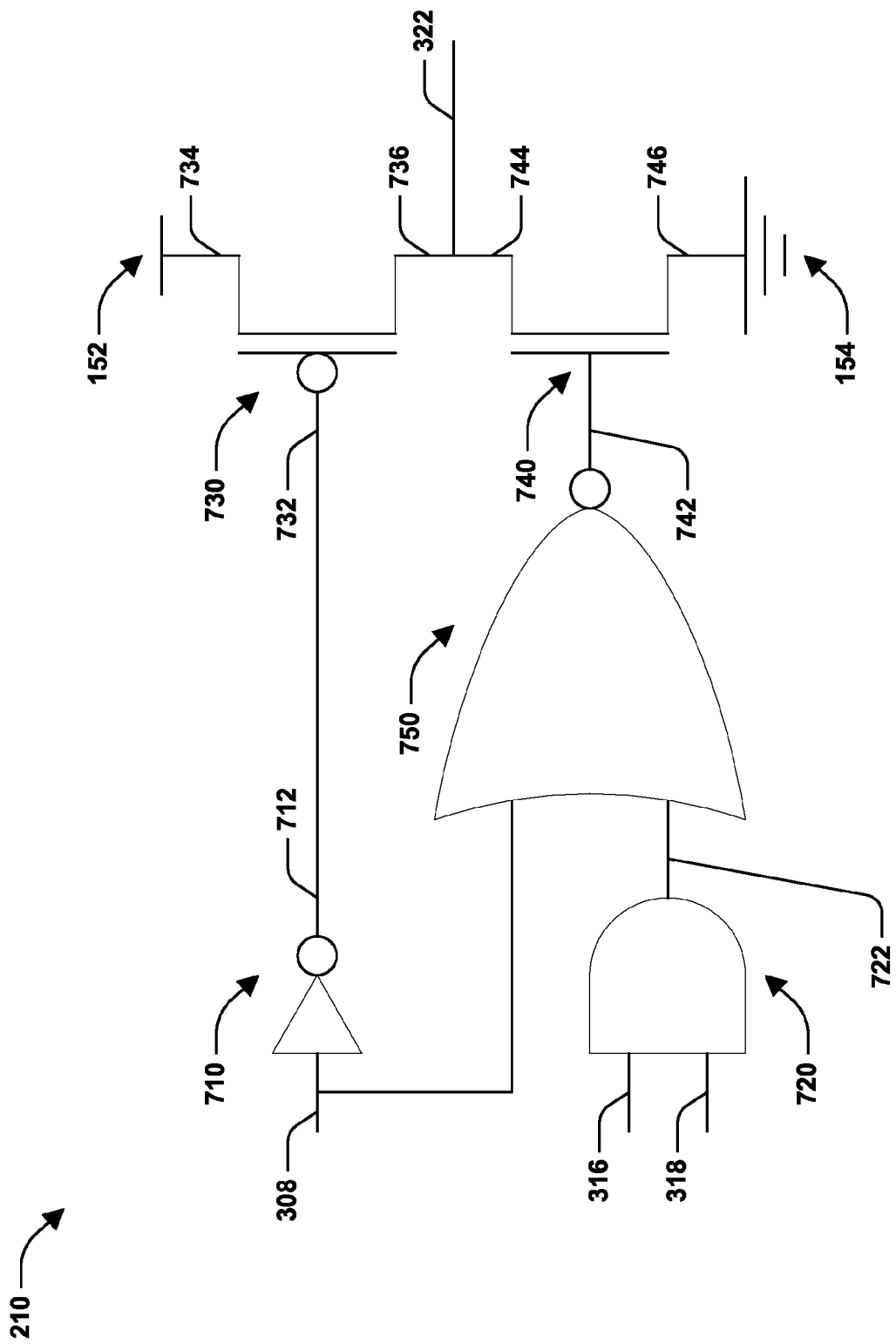
FIG. 7 is a schematic diagram of an example pull-up control unit for a header circuit for controlling a supply voltage of a cell, according to some embodiments.

FIG. 7 is a schematic diagram 210 of an example pull-up control unit for a header circuit for controlling a supply voltage of a cell, according to some embodiments. For example, the pull-up control unit is configured to control biasing for a first gate of a first pull-up PMOS transistor, such as the first gate 112 of the first pull-up PMOS transistor 110. In some embodiments, the pull-up control unit comprises an inverter 710, an AND gate 720, a first NOR gate 750, a third PMOS transistor 730, and a fourth n-type metal-oxide-semiconductor (NMOS) transistor 740. For example, the inverter 710 comprises an input 308 and an output 712, the AND gate 720 comprises a first input 316, a second input 318, and an output 722, the first NOR gate 750 comprises a first input, a second input, and an output, the third PMOS transistor 730 comprises a gate 732, a source 734, and a drain 736, the fourth NMOS transistor 740 comprises a gate 742, a source 746, and a drain 744. In some embodiments, the input of the inverter 308 is connected to a shut down signal and the output of the inverter is connected to the gate of the third PMOS transistor 732. Additionally, the first input 316 of the AND gate is connected to a bank select signal and the second input 318 of the AND gate is connected to a write mux signal. In other embodiments, the first input 316 of the AND gate is connected to the write mux signal and the second input 318 of the AND gate is connected to the bank select signal. In some embodiments, the output of the AND gate 722 is connected to an input of the first NOR gate 750. Additionally, another input of the first NOR gate 750 is connected to the shut down signal. In some embodiments, the output of the first NOR gate 750 is connected to the gate of the fourth NMOS transistor 742. According to some aspects, the source of the third PMOS transistor 734 is connected to Vdd 152, the source of the fourth NMOS transistor 746 is connected to Vss 154, and the drain of the third PMOS transistor 736 and the drain of the fourth NMOS transistor 744 are connected to an output of the pull-up control unit 322. In some embodiments, the output of the first NAND gate 322 is a pull-up control signal. Accordingly, the output of the pull-up control unit 322 is connected to a first gate of a first pull-up PMOS transistor, such as the first gate 112 of the first pull-up PMOS transistor 110 of FIG. 1, FIG. 2, FIG. 5, or FIG. 6, for example. Therefore, the first gate 112 of the first pull-up PMOS transistor 110 is biased based on at least one of the shut down signal, the bank select signal, or the write mux signal. It will be appreciated that in other embodiments, any combination of logic is used for the pull-up control unit, so long as a truth table of the combination of logic is equivalent to a truth table for the schematic diagram 210 of the example pull-up control unit.

Figure 8:
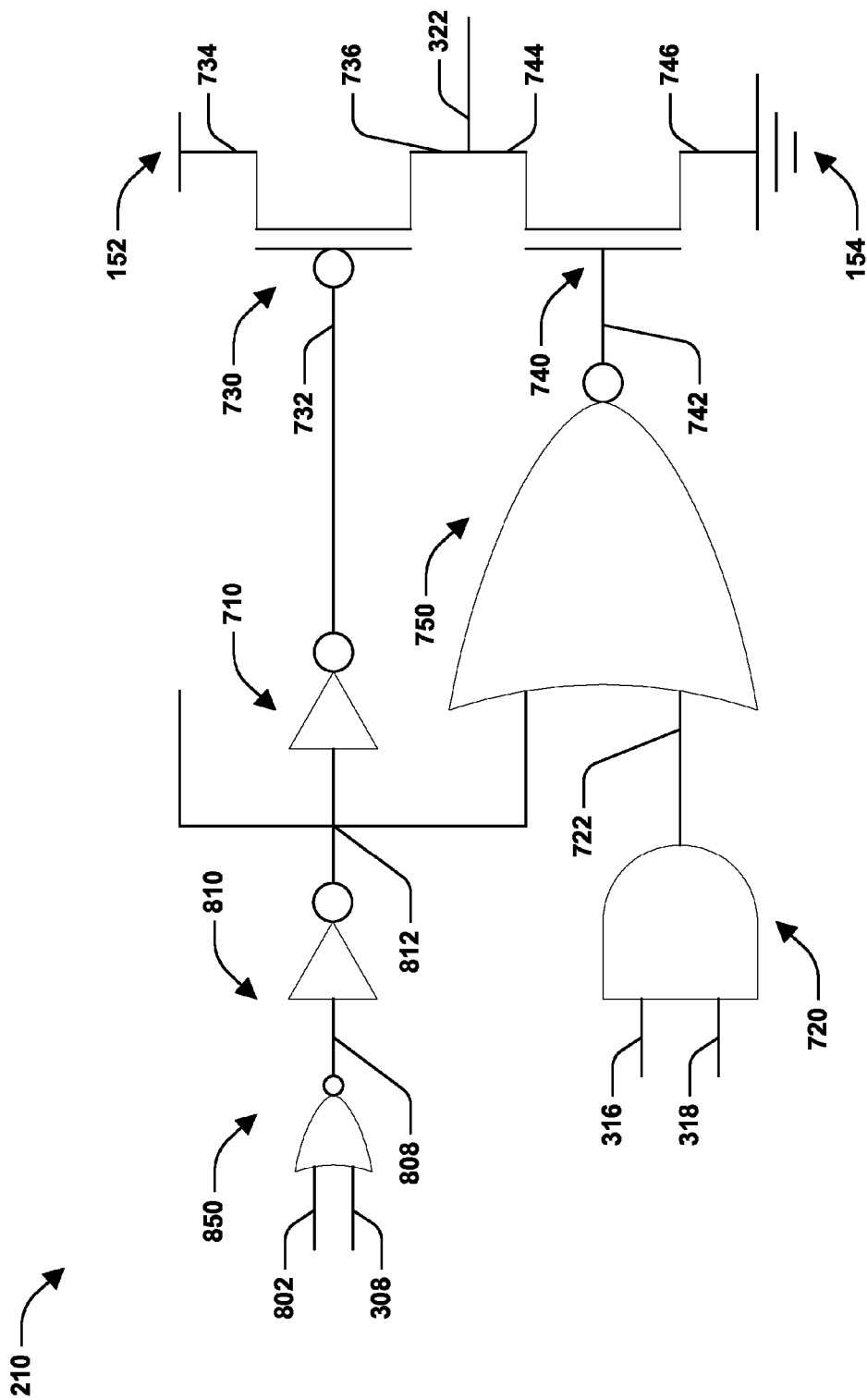
FIG. 8 is a schematic diagram of an example pull-up control unit for a header circuit for controlling a supply voltage of a cell, according to some embodiments.

FIG. 8 is a schematic diagram 210 of an example pull-up control unit for a header circuit for controlling a supply voltage of a cell, according to some embodiments. For example, the pull-up control unit is configured to control biasing for a first gate of a first pull-up PMOS transistor, such as the first gate 112 of the first pull-up PMOS transistor 110. In some embodiments, the pull-up control unit comprises a first inverter 710, a second inverter 810, a first NOR gate 750, a second NOR gate 850, an AND gate 720, a third PMOS transistor 730, and a fourth n-type metal-oxide-semiconductor (NMOS) transistor 740. For example, the first inverter comprises an input and an output, the second inverter comprises an input 808 and an output 812, the first NOR gate 750 comprises a first input, a second input, and an output, the second NOR gate 850 comprises a first input 802, a second input 308, and an output, the AND gate 720 comprises a first input 316 and a second input 318, and an output 722, the third PMOS transistor 730 comprises a gate 732, a source 734, and a drain 736, the fourth NMOS transistor 740 comprises a gate 742, a source 746, and a drain 744. In some embodiments, the first input of the second NOR gate 802 is connected to a shut down input signal. In some embodiments, the shut down input signal is generated based on a shut down output signal of another header circuit, such as a previous header circuit or a second header circuit in series with a first header circuit. For example, the first header circuit is a header circuit of FIG. 1, FIG. 2, FIG. 5, or FIG. 6, for example. Similarly, the second header circuit is a header circuit of FIG. 1, FIG. 2, FIG. 5, or FIG. 6, connected in series with the first header circuit, for example. In some embodiments, the second input of the second NOR gate 308 is connected to a shut down signal. The output of the second NOR gate 850 is connected to an input of the second inverter 808 in some examples. Additionally, the output of the second inverter 812 is the shut down output signal, such as the shut down input signal for a next header circuit, for example. In some embodiments, the output of the second inverter 812 is connected to the input of the first inverter 710 and at least one of the first input of the first NOR gate 750 or the second input of the first NOR gate 750. The output of the first inverter 710 is connected to the gate of the third PMOS transistor 732. Additionally, the first input 316 of the AND gate is connected to a bank select signal and the second input 318 of the AND gate is connected to a write mux signal. In other embodiments, the first input 316 of the AND gate is connected to the write mux signal and the second input 318 of the AND gate is connected to the bank select signal. In some embodiments, the output of the AND gate 722 is connected to an input of the first NOR gate 750, such as at least one of the first input or the second input of the first NOR gate 750. In some embodiments, the output of the first NOR gate 750 is connected to the gate of the fourth NMOS transistor 742. According to some aspects, the source of the third PMOS transistor 734 is connected to Vdd 152, the source of the fourth NMOS transistor 746 is connected to Vss 154, and the drain of the third PMOS transistor 736 and the drain of the fourth NMOS transistor 744 are connected to an output of the pull-up control unit 322. In some embodiments, the output of the first NAND gate 322 is a pull-up control signal. Accordingly, the output of the pull-up control unit 322 is connected to a first gate of a first pull-up PMOS transistor, such as the first gate 112 of the first pull-up PMOS transistor 110 of FIG. 1, FIG. 2, FIG. 5, or FIG. 6, for example. Therefore, the first gate 112 of the first pull-up PMOS transistor 110 is biased based on at least one of the shut down signal, the bank select signal, the write mux signal, the shut down input signal or the shut down output signal. It will be appreciated that in other embodiments, any combination of logic is used for the pull-up control unit, so long as a truth table of the combination of logic is equivalent to a truth table for the schematic diagram 210 of the example pull-up control unit.

Figure 9:
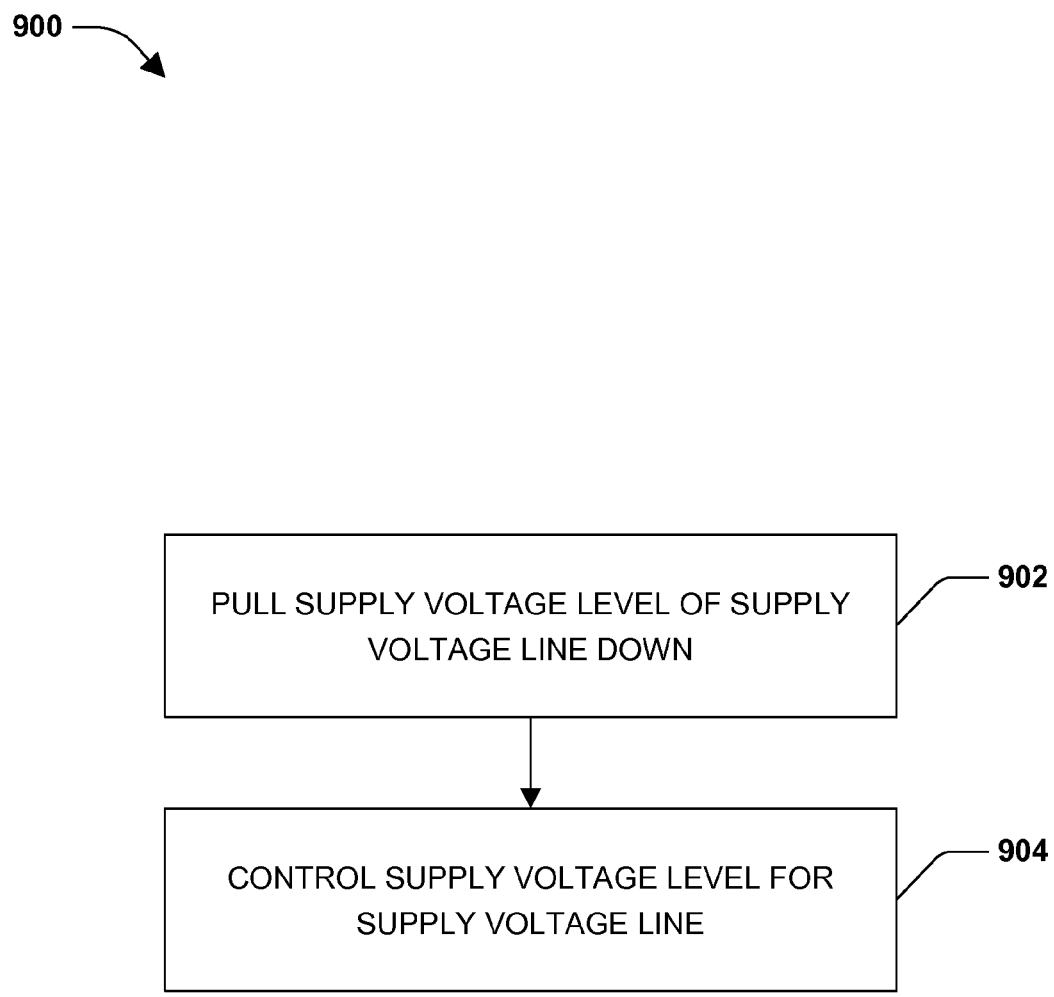
FIG. 9 is a flow diagram of an example method for controlling a supply voltage for a cell, according to some embodiments.

FIG. 9 is a flow diagram of an example method 900 for controlling a supply voltage for a cell, according to some embodiments. For example, at 902, the method comprises pulling a supply voltage level of a supply voltage line down based at least in part on a pull-down unit. Additionally, at 904, the method comprises controlling the supply voltage level for the supply voltage line based at least in part on the pull-down unit and a passing unit connected to the pull-down unit and the supply voltage line.

Figure 10:
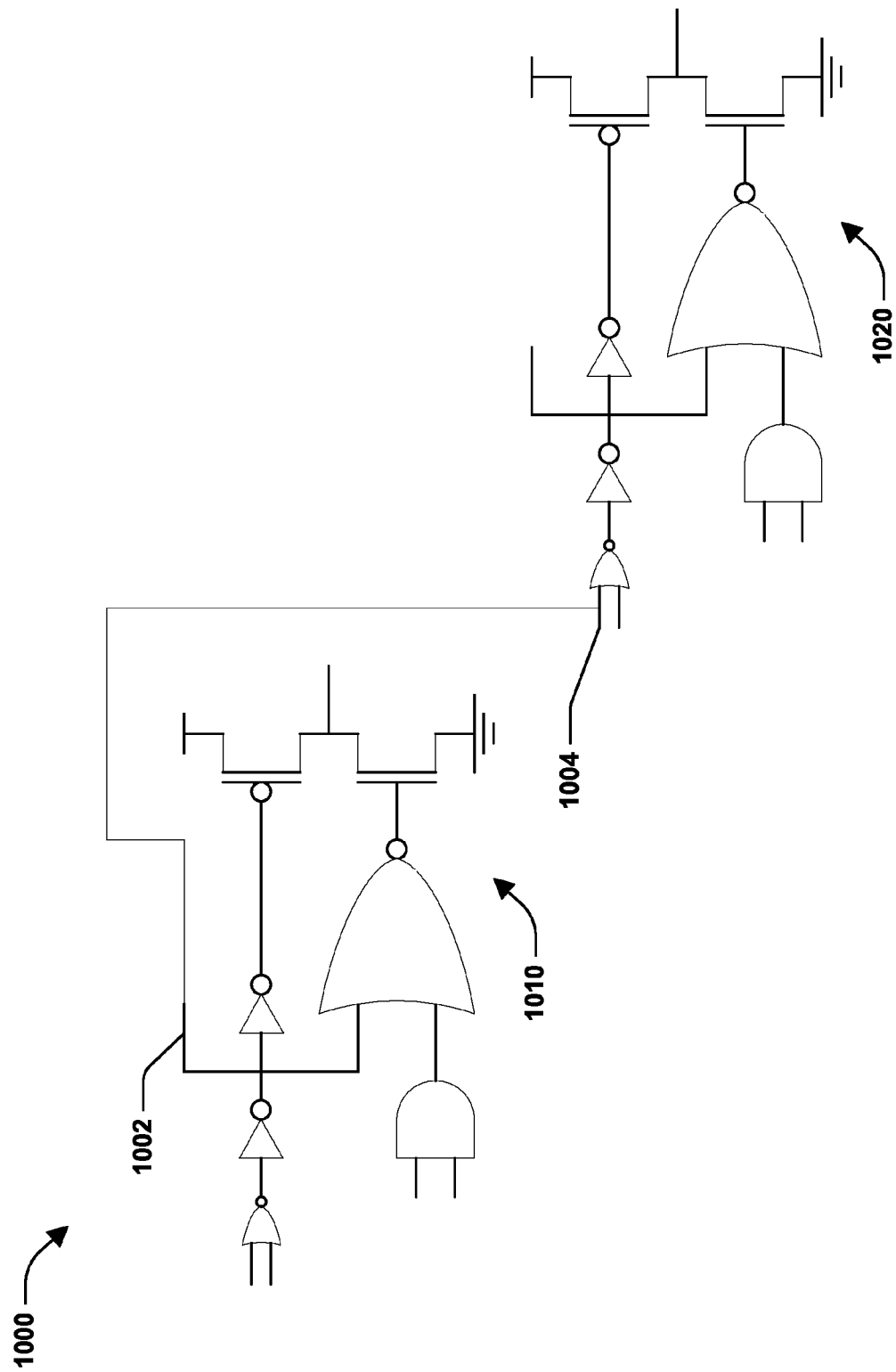
FIG. 10 is a schematic diagram of an example pull-up control unit for a header circuit cascaded with another pull-up control unit for another header circuit, according to some embodiments.

FIG. 10 is a schematic diagram 1000 of an example pull-up control unit for a header circuit cascaded with another pull-up control unit for another header circuit, according to some embodiments. For example, the schematic diagram comprises a first pull-up control unit for a first header circuit 1010 and a second pull-up control unit for a second header circuit 1020. According to some aspects, at least one of the first header circuit 1010 or the second header circuit 1020 is a header circuit such as the header circuit 210 of FIG. 8, for example. In some embodiments, a shut down output signal 1002 for the first pull-up control unit is connected to a shut down input signal 1004 for the second pull-up control unit. Therefore, the pull-up control units of FIG. 10 are configured to cascade or ripple a turn on sequence where the first pull-up control unit activates the first header circuit and the second pull-up control unit at a first time before the second pull-up control unit activates the second header circuit. For example, the first pull-up control unit is configured to activate a second header circuit after the first header circuit pulls a supply voltage level of a supply voltage line down to a threshold voltage, such as a PMOS threshold voltage. Accordingly, a header circuit wakeup sequence is provided such that a second header circuit wakes up following a first header circuit waking up, a third header circuit wakes up following the second header circuit, etc. In this way, the header circuit is configured to enhance write-ability of the SRAM cell, such as a static random access memory (SRAM) cell, mitigate leakage current associated with shut down, or mitigate leakage associated with wake up at least because a peak current associated with activating or waking up one or more header circuits is reduced via sequential wake up.

Figure 11:
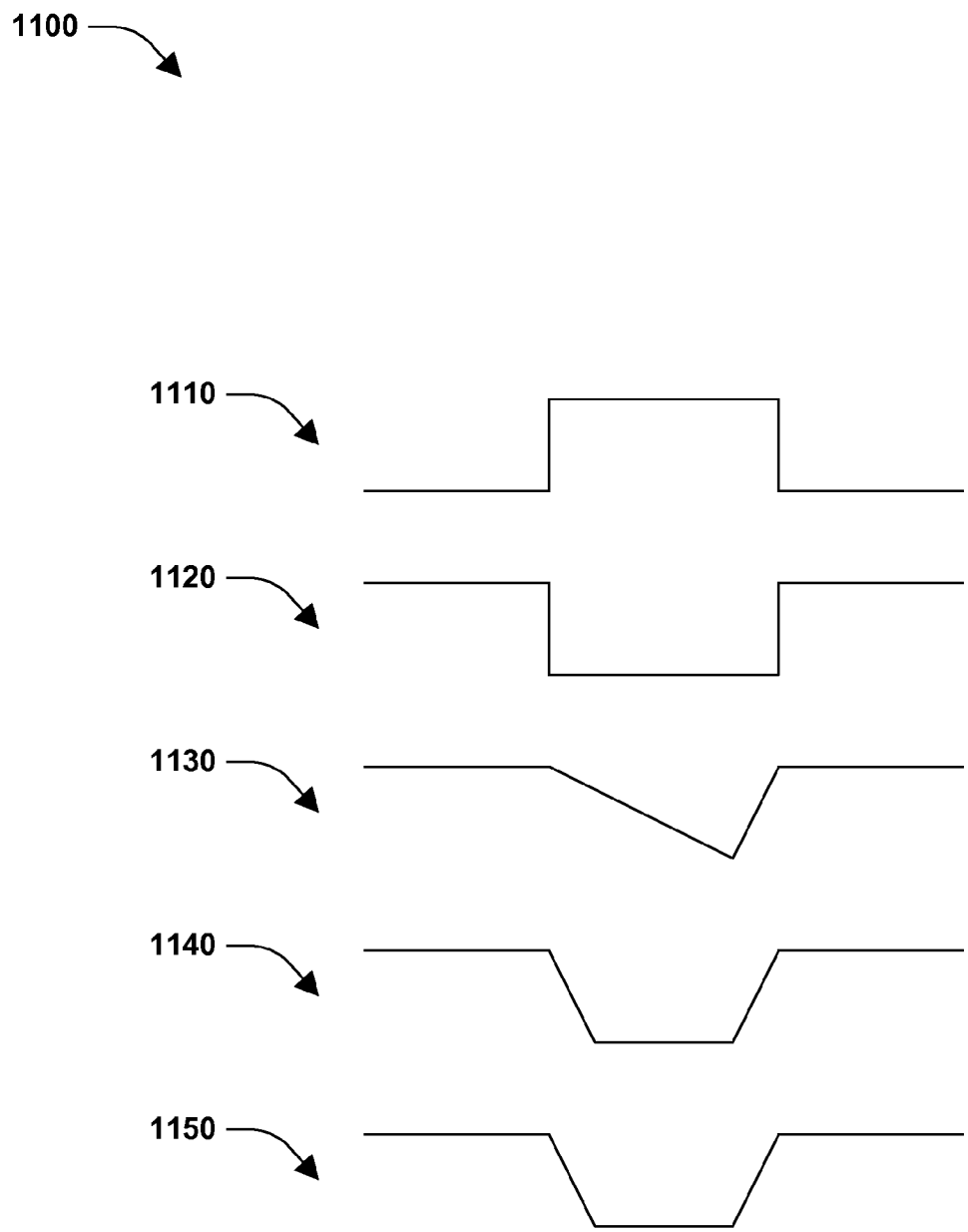
FIG. 11 is a timing diagram for an example header circuit for controlling a supply voltage for a cell, according to some embodiments.

FIG. 11 is a timing diagram 1100 for an example header circuit for controlling a supply voltage for a cell, according to some embodiments. In some embodiments, at least some of the timing waveforms of 1100 are associated with a write assist operation for a cell. For example, at 1100, an output of a pull-up control unit 322, such as the pull-up control unit 210 of FIG. 5 is illustrated. In some embodiments, the output of the pull-up control unit, such as output 322 of at least one of FIG. 3 or FIG. 7 is associated with 1110 or is logic high during the write assist operation. Additionally, at 1120, an output of a pull-down control unit 422, such as the pull-down control unit 220 of FIG. 4 or an output of a pull-down control unit, such as the pull-down control unit 220 of FIG. 5 is illustrated. In some embodiments, the output of the pull-down control unit, such as output 422 of FIG. 4 is associated with 1120 or is logic low during the write assist operation. In some embodiments, 1130 is a waveform associated with a voltage level of a supply voltage line, such as the supply voltage line 130 of FIG. 1. In some embodiments the waveform 1130 of the voltage level of the supply voltage line 130 is associated with a header circuit configured similarly to the header circuit of FIG. 2, for example. Additionally, the waveform 1130 is associated with a header circuit utilizing a pull-up control unit configured similarly to the pull-up control unit of FIG. 3, for example. In some embodiments, a pull-up control unit is in a high-z state, such as a high impedance state. For example, at least one of the pull-up control unit 210 of FIG. 7 or FIG. 8 is in a high-z state. For another example, the pull-up control unit of FIG. 6 is in the high-z state. Accordingly, the pull-up control unit or the pull-up control unit is viewed as disconnected from a header circuit during the high-z state or as an open circuit, and does not control the pull-up transistor, such as the first pull-up PMOS transistor 110. In some embodiments, transistors 730 and 740 of at least one of FIG. 7 or FIG. 8 are off during the high-z state. In some embodiments, 1140 is a waveform associated with the output of the pull-up control unit, such as output 322 during write assist for a cell, at least because the output of the pull-up control unit 322 is connected to the supply voltage line 130 via the passing transistor 630, such as in FIG. 6, for example. Similarly, 1150 is a waveform associated with a voltage level of the supply voltage line 130, at least because the supply voltage line 130 is connected to the output of the pull-up control unit 322. In some embodiments, the waveform 1140 of the voltage level of the supply voltage line 130 is associated with a header circuit configured similarly to the header circuit of FIG. 6, for example. Additionally, in some embodiments, the waveform 1140 is associated with a header circuit utilizing a pull-up control unit configured similarly to at least one of FIG. 7 or FIG. 8. It will be appreciated that in some embodiments, the first pull-up PMOS transistor 110 is controlled by the supply voltage line 130 during the high-z state of the pull-up control unit 210, at least because the supply voltage line 130 is connected to gate 112 of the first pull-up PMOS transistor 110.

According to some aspects, a header circuit for controlling a supply voltage for a cell is provided, comprising a first pull-up p-type metal-oxide-semiconductor (PMOS) transistor, the first pull-up PMOS transistor comprising a first gate, a first source, and a first drain. In some embodiments, the header circuit comprises a second pull-down PMOS transistor, the second pull-down PMOS transistor comprising a second gate, a second source, and a second drain, the first drain of the first pull-up PMOS transistor connected to the second source of the second pull-down PMOS transistor and a supply voltage line for a cell. Additionally, the header circuit comprises a passing unit configured to control a connection between the first gate of the first pull-up PMOS transistor and the first drain of the first pull-up PMOS transistor.

According to some aspects, a header circuit for controlling a supply voltage for a cell is provided, comprising a first pull-up p-type metal-oxide-semiconductor (PMOS) transistor, the first pull-up PMOS transistor comprising a first gate, a first source, and a first drain. In some embodiments, the header circuit comprises a second pull-down PMOS transistor, the second pull-down PMOS transistor comprising a second gate, a second source, and a second drain, the first drain of the first pull-up PMOS transistor connected to the second source of the second pull-down PMOS transistor and a supply voltage line for a cell. Additionally, the header circuit comprises a passing unit configured to control a connection between the first gate of the first pull-up PMOS transistor and the first drain of the first pull-up PMOS transistor.

According to some aspects, a method for controlling a supply voltage for a cell is provided, comprising pulling a supply voltage level of a supply voltage line down based at least in part on a pull-down unit. The method comprises controlling the supply voltage level for the supply voltage line based at least in part on the pull-down unit and a passing unit connected to the pull-down unit and the supply voltage line.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated based on this description. Further, it will be understood that not all operations are necessarily present in each embodiment provided herein.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur based on a reading and understanding of this specification and the annexed drawings. The disclosure includes all such modifications and alterations and is limited only by the scope of the following claims.

What is claimed is:

1. A header circuit for controlling a supply voltage for a cell, comprising:
   a first pull-up p-type metal-oxide-semiconductor (PMOS) transistor, the first pull-up PMOS transistor comprising a first gate, a first source, and a first drain;
   a pull-up control unit configured to control biasing for the first gate of the first pull-UP PMOS transistor based on a shut down signal, a bank select signal, and a write mux signal, the shut down signal corresponding to a first logic state when a header circuit is to be in a shutdown mode and corresponding to a second logic state when the header circuit is to be in a non-shutdown mode; and
   a second pull-down PMOS transistor, the second pull-down PMOS transistor comprising a second gate, a second source, and a second drain, the first drain of the first pull-up PMOS transistor coupled to the second source of the second pull-down PMOS transistor and a supply voltage line for a cell.

2. The header circuit of claim 1, the pull-up control unit coupled to a second pull-up control unit of a second header circuit for a second cell different than the cell.

3. The header circuit of claim 1, the pull-up control unit configured to bias the first gate of the first pull-up PMOS transistor logic high based on a write assist operation for the cell.

4. The header circuit of claim 1, comprising a pull-down control unit configured to control biasing for the second gate of the second pull-down PMOS transistor.

5. The header circuit of claim 4, the pull-down control unit configured to bias the second gate of the second pull-down PMOS transistor logic low based on a write assist operation for the cell.

6. The header circuit of claim 1, comprising a passing unit configured to control a coupling between the first gate of the first pull-up PMOS transistor and the first drain of the first pull-up PMOS transistor.

7. The header circuit of claim 6, the first source of the first pull-up PMOS transistor coupling to a positive supply voltage (Vdd) and the second drain of the second pull-down PMOS transistor coupled to a negative supply voltage (Vss).

8. The header circuit of claim 7, the first pull-up PMOS transistor configured to selectively couple the Vdd to the supply voltage line.

9. The header circuit of claim 1, the pull-up control unit configured to:
activate a second header circuit for a second cell after the header circuit pulls a supply voltage of supply voltage line to a threshold voltage.

10. The header circuit of claim 1, the pull-up control unit configured to:
bias the first gate opposite of a pull-down control unit configured to control biasing for the second gate of the second pull-down PMOS transistor; and
generate a shut down output signal for the second header circuit.

11. A header circuit for controlling a supply voltage for a cell, comprising:
a first pull-up p-type metal-oxide-semiconductor (PMOS) transistor, the first pull-up PMOS transistor comprising a first gate, a first source, and a first drain;
a second pull-down PMOS transistor, the second pull-down PMOS transistor comprising a second gate, a second source, and a second drain, the first drain of the first pull-up PMOS transistor coupled to the second source of the second pull-down PMOS transistor and a supply voltage line for a cell; and
a pull-up control unit configured to control biasing for the first gate of the first pull-UP PMOS transistor, the pull-up control unit coupled to a second pull-up control unit of a second header circuit for a second cell different than the cell and configured to generate a shut down output signal for transmission to the second pull-up control unit to initiate a shut down at the second header circuit.

12. The header circuit of claim 11, comprising a passing unit configured to control a coupling between the first gate of the first pull-up PMOS transistor and the first drain of the first pull-up PMOS transistor.

13. The header circuit of claim 12, the passing unit comprising a PMOS transistor comprising a passing gate, a passing source, and a passing drain, the passing source coupled to the first gate, the passing gate coupled to the second gate, the passing drain coupled to the first drain, the second source, and the supply voltage line.

14. The header circuit of claim 11, the pull-up control unit configured to bias the first gate based on at least one of a shut down signal, a bank select signal, or a write mux signal.

15. The header circuit of claim 11, comprising a pull-down control unit configured to control biasing for the second gate of the second pull-down PMOS transistor.

16. The header circuit of claim 15, the pull-down control unit configured to bias the second gate logic low based on a write assist operation for the cell.

17. The header circuit of claim 11, the pull-up control unit configured to activate the second header circuit after the header circuit pulls down a supply voltage of the supply voltage line to a threshold voltage.

18. The header circuit of claim 17, the pull-up control unit configured to control biasing for the first gate of the first pull-up PMOS transistor based on a shut down signal, a bank select signal, and a write mux signal.

19. The header circuit of claim 11, the first source coupled to a positive supply voltage (Vdd) and the second drain coupled to a negative supply voltage (Vss).

20. A method for initiating shut-down of header circuits of a memory arrangement, comprising:
receiving a shut down signal at a pull-up control unit of pull-up unit of a header circuit for a memory cell of the memory arrangement, the shut down signal configured to initiate a shut down of the header circuit; and
transmitting a shut down output signal from the pull-up control unit to a second pull-up control unit of a second pull-up unit of a second header circuit for a second memory cell of the memory arrangement responsive to the receiving a shut down signal, the shut down output signal configured to initiate a shut down of the second header circuit.

\* \* \* \* \*